United States Patent [19]
Cash, Jr.

[11] Patent Number: 6,108,397
[45] Date of Patent: Aug. 22, 2000

[54] COLLIMATOR FOR X-RAY PROXIMITY LITHOGRAPHY

[75] Inventor: Webster C. Cash, Jr., Boulder, Colo.

[73] Assignee: Focused X-Rays, LLC, Boulder, Colo.

[21] Appl. No.: 09/196,472

[22] Filed: Nov. 19, 1998

Related U.S. Application Data

[60] Provisional application No. 60/066,510, Nov. 24, 1997.

[51] Int. Cl.[7] .................................................. G21K 5/00
[52] U.S. Cl. ................................ 378/34; 378/85
[58] Field of Search ......................... 378/34, 85

[56] References Cited

U.S. PATENT DOCUMENTS

5,339,346  8/1994  White .
5,604,782  2/1997  Cash, Jr. .

*Primary Examiner*—Craig E. Church
*Attorney, Agent, or Firm*—Dorr, Carson, Sloan & Birney, P.C.

[57] ABSTRACT

A new class of x-ray optic suitable for use in x-ray proximity lithography employs many mirror facets arranged in a grazing incidence geometry at a relatively large distance from the mask. Each mirror facet is substantially flat in that its radius of curvature is substantially larger than the target. Each facet creates an optically independent channel that covers the entire target. The facets are arranged so that many channels can simultaneously illuminate the target, thereby achieving high flux at the target with high uniformity. Constraints on local and global divergence at the mask are met by making the optic sufficiently small and placing it sufficiently distant from the target.

26 Claims, 11 Drawing Sheets

COLLIMATOR FOR X-RAY PROXIMITY LITHOGRAPHY

RELATED APPLICATION

The present application is based on the Applicant's U.S. Provisional Patent Application Ser. No. 60/066,510, entitled "Collimator For X-Ray Proximity Lithography," filed on Nov. 24, 1997.

BACKGROUND OF THE INVENTION

1. Field of the Invention

The present invention relates generally to the field of x-ray collimators. More specifically, the present invention discloses an x-ray collimator for use primarily in x-ray proximity lithography for semiconductor fabrication.

2. Statement of the Problem

X-ray lithography has been used experimentally in the past for etching semiconductor wafers. However, existing x-ray lithography systems have not been commercially viable due to a number of significant shortcomings, particularly the speed, cost, complexity, and size of such x-ray lithography systems.

For success in a commercial environment, an x-ray lithography system should be able to meet stringent collimation requirements. Specific performance requirements have been set by Sematech, as part of a roadmap for the future of lithography. Until now, no x-ray collimator has been able to achieve all of the requirements simultaneously. In particular, the tight beam uniformity requirement had never been solved. The x-ray collimator must reduce global divergence to remove all pattern shadowing in the resist, i.e., approximately 20 milli-radians over a 30 mm square mask. Local beam divergence should be reduced to below the level of diffraction in the mask features, i.e., approximately 10 milli-radians diameter. Beam uniformity should be within ±3% everywhere across the 30 mm square wafer.

In the exposure of an x-ray photoresist, as with a visible light photoresist, a variation in beam intensity will cause a variation in the exact width of the resultant feature. This effect is called depth of exposure. High precision circuits have strenuous limitations on feature width variations, so a tight constraint on exposure uniformity and beam uniformity is required. The ±3% beam uniformity specification is very hard to meet in the x-ray realm, where optics are highly absorbing and non-uniform.

The x-ray collimator must also meet gain requirements assuming a 100 W/steradian pinch source to deliver a beam with sufficient flux to support a production rate of 25 to 50 wafers per hour. In addition, the collimator optics must be robust and reliable. The x-ray collimator should not significantly increase the overall cost of the stepper, and should not have excessive space requirements.

The gain requirement is driven by the need for adequately fast systems. If speed were not the driving consideration, then the source could simply be moved back to four or five meters from the mask and meet the divergence criterion. The purpose of the collimator is to provide the low divergence with adequate signal. The speed of the stepper is controllrd by the wafer handling time, the step and align time per die, and the exposure time per die. A conventional stepper uses 22 seconds to insert and remove a wafer. It also requires one second per die to step and align. Assuming a typical number of 20 dice per wafer, we can then write an expression for the number of wafers per hour achievable:

$$W = \frac{3600}{22 + 20a + 20e}$$

where W is the wafers per hour, a is the step and align time in seconds, and e is the exposure time in seconds. Since a is known to be 1 sec, with an exposure time of zero, the system would handle 85 wafers per hour. In Table 1, we show the expected system throughput as a function of the exposure time:

TABLE 1

| | System Speed | |
| --- | --- | --- |
| Exposure (sec) | Wafers/hr | Beam (mW) |
| 0 | 85 | ∞ |
| .25 | 76 | 1800 |
| 1 | 58 | 450 |
| 1.5 | 50 | 300 |
| 2 | 43 | 225 |
| 3 | 35 | 150 |
| 5 | 25 | 90 |
| 8 | 17 | 56 |
| 10 | 14 | 45 |
| 15 | 10 | 30 |

To achieve 10 wafers per hour requires 15 second exposures, 20 wafers per hour requires 7 second exposures, and 30 wafers per hour requires 4 second exposures. To convert exposure time to beam intensity we must assume a resist sensitivity. As sensitivity is a function of wavelength, we must choose a number that is representative of the speed after convolution with the incident spectrum. For our purposes, an exposure of 50 mJ/cm$^2$ is reasonable. It will thus require 450 mJ to expose a 30 mm square. These numbers have been used to generate the third column of Table 1.

Inspection of the above table gives some sense of the beam requirements for an x-ray collimator. First, there is no sense in pushing much above one watt in the collimated beam, because the exposure time has already dropped to a negligible fraction of the time spent on each die. Similarly, a beam with less than about 20 mW will yield below 10 wafers an hour and render the stepper commercially non-viable unless it is quite inexpensive. The present collimator has been designed around these numbers.

3. Solution to the Problem

None of the prior art shows a collimator for use in x-ray lithography that meets all of the conditions for commercially viable in terms of speed, cost, complexity, size, throughput, and collimation tolerances for an x-ray lithography systems. In particular, none of the prior art systems have been able to combine high beam intensity with the high beam uniformity required by depth of exposure considerations. In contrast, the present system is able to meet these stringent requirements using multiple sets of small, flat or curved mirrors at grazing incidence, bundled tightly and placed at the correct distance from the mask and wafer.

SUMMARY OF THE INVENTION

This invention provides a collimator for x-ray lithography employing a new class of x-ray optic that consists of many mirror facets arranged in a grazing incidence geometry at a relatively large distance to the mask. Each mirror facet is either flat or substantially flat in that its radius of curvature is substantially larger than the target. Each mirror facet creates an optically independent channel that covers the entire mask with a highly uniform beam. The facets are arranged so that many channels can simultaneously illuminate the target, thereby achieving high flux at the target. Many of the resulting geometries mimic the overall appearance of a conventional Wolter or Kirkpatrick-Baez optic, but the internal facets render the optical performance substantially different, in particular delivering extraordinarily high uniformity. Constraints on local and global divergence at the mask are met by making the optic sufficiently small and placing it sufficiently distant from the target.

These and other advantages, features, and objects of the present invention will be more readily understood in view of the following detailed description and the drawings.

BRIEF DESCRIPTION OF THE DRAWINGS

The present invention can be more readily understood in conjunction with the accompanying drawings, in which.

DETAILED DESCRIPTION OF THE INVENTION

As an overview, the present major components of the present invention can be summarized as follows:
1. Global Divergence Allows Small Mirrors at Acceptable Distances The global divergence requirement for the collimator is set by the range of angles at which the radiation can strike the photoresist and leave an acceptable profile of exposure as a function of depth. This number has been set at about 0.02 radians for the generations of proximity work down to 0.12 $\mu$. This must be maintained across a field of exposure that is 30 mm square. Thus a divergence point, D, is naturally defined at a distance of D=F/G, where F is the diameter of the field, and G is the global divergence maximum expressed in radians. Thus, with the current requirements, a point source must be at least 2.121 meters from the mask. (note, F is 42.4 mm diagonally across the 30 mm field.)

Consider the implications of this. If an optic is placed near or beyond the divergence point, it can be very small. Normally, in collimator design one expects the exit aperture of the collimator to be the same size as the field of exposure, as the rays must be held to a global divergence requirement that is much tighter than the 0.02 radians needed for proximity lithography.

There is a tremendous advantage to the use of small exit apertures. Small exit apertures lead to uniformity at the target, since imperfections are naturally washed out as the beam covers the relatively large distance between exit aperture and the mask.

2. Small Optic Near Divergence Point Meets Local Divergence Criterion

Proximity lithography also requires that a local divergence requirement, L, be met. This is the blur of the beam around the average direction. Currently this must be less than 0.01 radians diameter everywhere in the exposure field. For a conventional collimated beam this is a measure of the quality of the collimation. For a divergent point source geometry, it provides an upper limit to the size of the emitting region E=L·d, where L is this local divergence requirement in radians and d is the distance to source, presumably close to the divergence point D discussed above.

For L=0.01, and d=2.121, the aperture from which all rays emanate must be less than 21.21 mm across. But, this is a fairly large aperture. Many lenses, and even x-ray optics, can be made smaller than two centimeters. Any ray that leaves the 2 cm aperture at a distance greater than 2.1 m, and strikes the mask will automatically satisfy both the local and global divergence requirements.

3. Gather Large Solid Angle with Many Small Mirrors

Within the one centimeter aperture requirement, the goal is to concentrate as many x-rays as possible. Collimator systems function through effective use of solid angle. Size is unimportant. This is especially true in grazing incidence systems, where the reflection angles must be small. At a graze angle of two degrees, a single mirror cannot collect significantly more than a two degree range of angles, yet an efficient collimator requires a much larger solid angle than four square degrees.

The present invention is ideally suited to solving this problem. We simply build an array of mirrors which collects x-rays from a larger solid angle. All the channels will direct their light through the aperture. Mirror arrays are standard in grazing incidence optics to increase efficiency. However, in collimator systems they have a major drawback. Where the fields of the separate systems overlap it is very difficult to maintain high flux uniformity. Our invention solves this problem neatly by avoiding the need for stitching—each individual channel is designed to spray its light uniformly across the mask. Then, the presence of multiple channels becomes a help, rather than a hindrance, since they tend to average out any non-uniformity from individual channels.

There is a large variety of ways to implement this invention, as discussed below. The essence of the invention is to allow an acceptable level of global divergence, and move back far enough to allow a small optical element. The element should then contain multiple mirrors within a diameter that satisfies the requirements of the local divergence. This approach is not possible in all applications that require collimators. It is merely true that the part of parameter space represented by this invention is acceptable to x-ray proximity lithography, and the resulting performance is highly desirable to the application.

The present invention also provides significant advantages over the prior art in terms of meeting other requirements:

Maximizing Flux. The most important aspect to maximizing the flux is to insert as many channels as possible, thereby maximizing the number of steradians of x-rays funneled through the exit aperture. It is not necessary for each channel to have the same brightness, as they all cover the entire mask.

Figure 1:
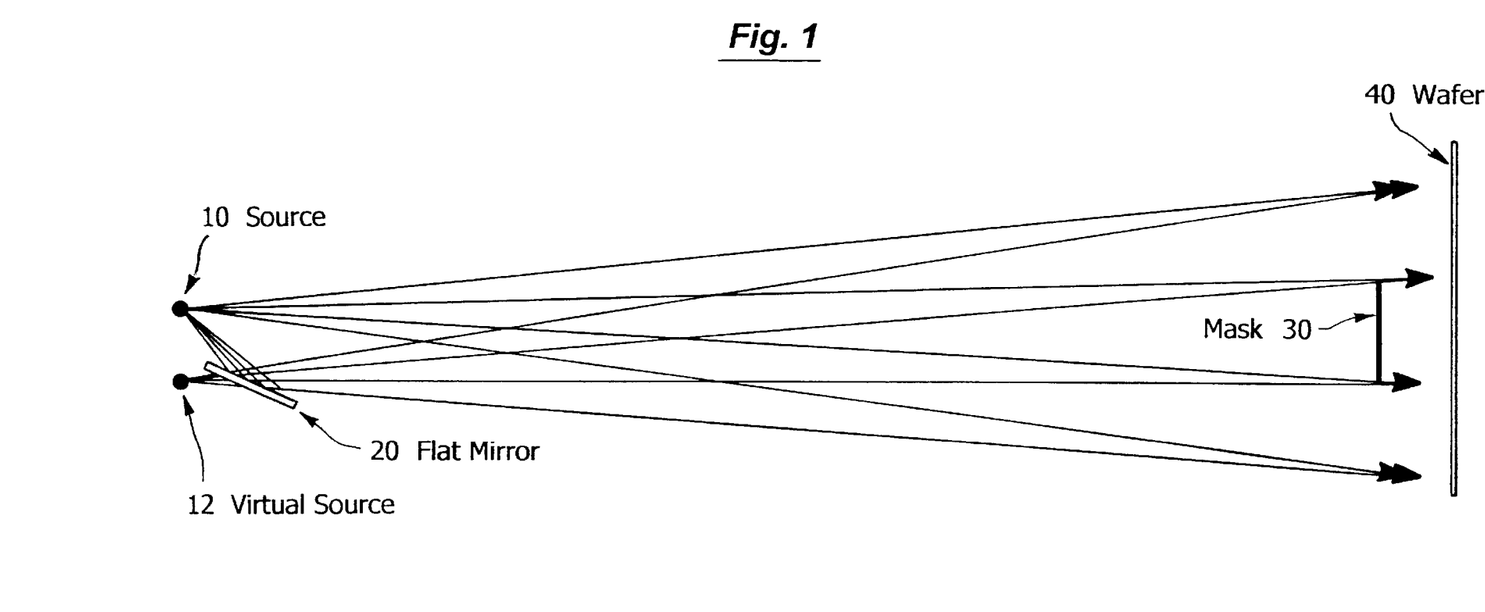
FIG. 1 is cross-sectional ray trace diagram of one channel in the present invention showing a single flat mirror at grazing incidence placed such that it reflects radiation onto a mask in a uniform pattern.

We start the design process with a single flat mirror 20 as shown in FIG. 1. The flat mirror 20 is placed at grazing incidence such that it reflects radiation onto a mask 30 and wafer 40 in a uniform pattern. It is made sufficiently large that the reflected image of the source 10 is visible from all points on the mask 30. If the virtual image 12 the flat 20 creates is sufficiently close to the original x-ray source 10, the global and local divergence requirements are met. If the mirror 20 does not occult the image, the flux from the mirror 20 is nearly as uniform as the direct beam. Only a small reflectivity effect is seen across the mask 30. If the reflectivity of the mirror is R, then the total flux at the mask has increased from 1 (direct beam) to 1+R. In a typical geometry, R could be 0.65, leading to a 65% improvement in beam intensity at the mask 30.

Figure 2:
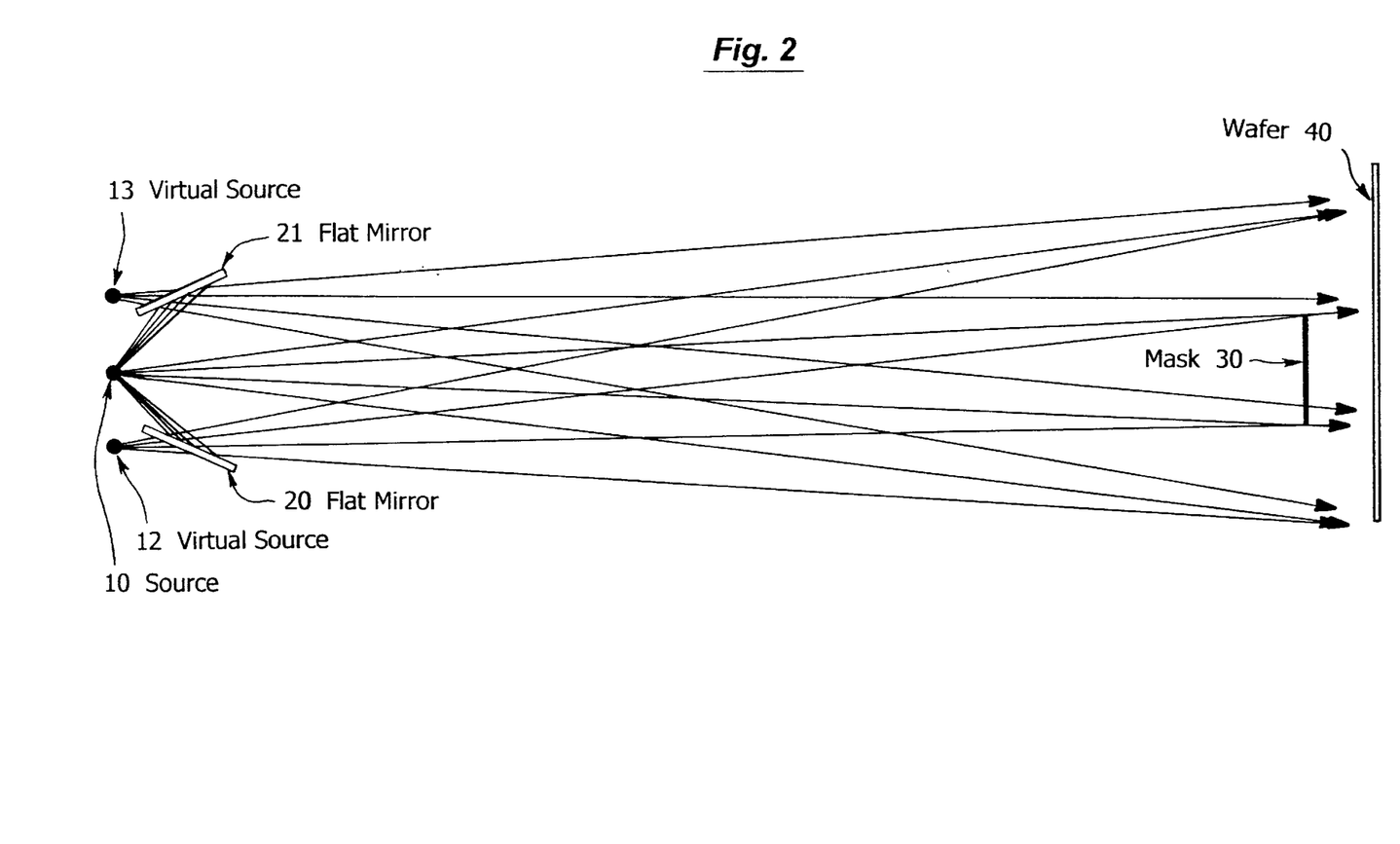
FIG. 2 is a cross-sectional ray trace diagram of one channel in the present invention that includes a second flat mirror at grazing incidence. Both mirrors redirect uniform radiation onto the mask.

In FIG. 2, we add a second flat mirror 21 that is opposite to the first mirror 20. The reflected rays from this mirror 21 also cover the mask 30 uniformly. A second virtual source 13 is created, which must lie no more than a distance, E, (typically 21.21 mm) from the first virtual source 12. By symmetry, the total flux at the mask is now 1+2R. The small beam non-uniformity due to the range of graze angles on the first mirror 20 is now removed, as the effect is very close to linear, and the beam from the second mirror 21 has almost exactly the opposite curve. The sum of the beam intensities from the mirrors 21 and 20 is flat across the mask 30.

Figure 3:
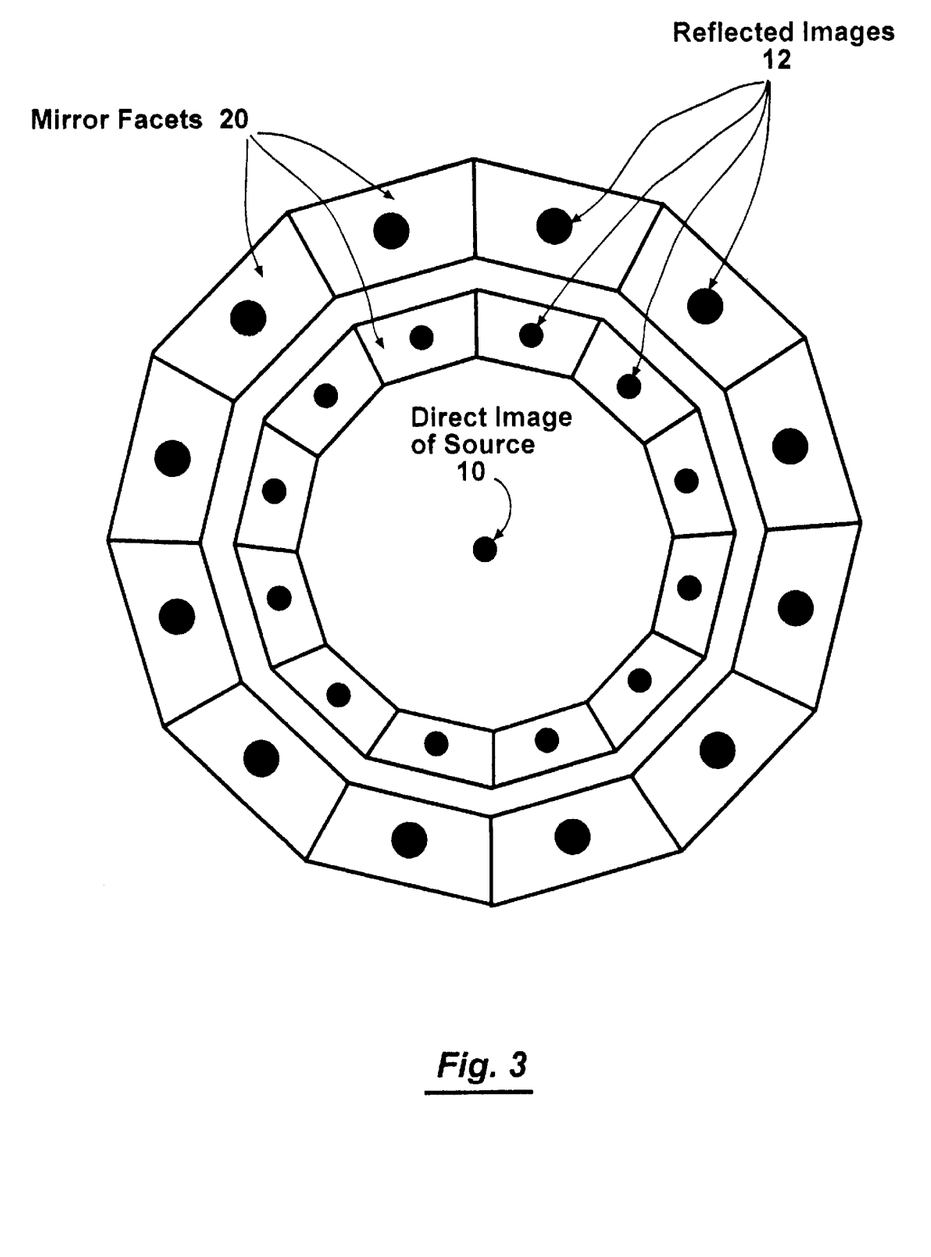
FIG. 3 is a view from the mask toward the x-ray source showing an array of two concentric rings of mirrors placed in an azimuthal geometry around the central x-ray source.

Additional flat mirrors may be placed in the cylindrical symmetry around the source 10 to mask 30 axis. FIG. 3 shows a view toward the azimuthal array of mirror facets 20 along the axis of symmetry. The mirrors may be allowed to grow until they touch, forming a conical shape with interior flat facets 20. Each facet 20 is trapezoidal in shape and projects a trapezoidal beam onto the mask 30. The number of facets in the ring is limited by the width of the trapezoid each projects onto the mask 30. Each trapezoid must be both wide enough and high enough that it will fully illuminate the mask 30.

It can be shown that the size of a mirror facet may be predicted by a direct formula. Assume one is designing a collimator in which the source 10 is to be a distance, d, from the mask 30. The mask has a maximum diameter, m, that must be covered with a uniform beam. If a facet rests with one end a distance z from the source, and r from the rotation axis, the position of the other end of the facet, r' and z', will be given by:

$$z' = \frac{\frac{r}{2} + \frac{z(r+m)}{2(d-z)}}{\frac{r}{d} + \frac{z(r+m)}{d(d-z)} + \frac{r}{2z} - \frac{r+m}{2(d-z)} - \frac{m}{d}} \quad \text{and}$$

$$r' = \frac{r}{2} + \frac{z(r+m)}{2(d-z)} + \frac{\frac{1}{z} \cdot \left(\frac{r}{2} + \frac{z(r+m)}{2(d-z)}\right)^2}{\frac{r}{d} + \frac{z(r+m)}{d(d-z)} + \frac{r}{2z} - \frac{r+m}{2(d-z)} - \frac{m}{d}}$$

The number of facets, N, that can be placed around the ring is given by:

$$N = \frac{\pi}{\tan^{-1}\left(\frac{m(z+z')}{d(r+r')}\right)}$$

FIG. 3 shows two concentric rings of flats. Most geometries allow multiple rings of flats, each redirecting the x-rays from a different divergence angle off source 10, back onto the same mask 30, thereby further increasing the flux. The rings can be nested, with the outside ring reflecting the x-rays at the largest angle. However, most of the time, a more convenient geometry is to stack the rings. The outer diameter of the inner ring becomes the inner diameter of the next ring. The maximum axial distance of the inner ring from the source 10 becomes the minimum axial distance of the next ring. The facets are effectively arranged around an ellipsoid.

Uniformity. The specification on uniformity can be particularly tight, often ±2%, which can be challenging in the x-ray regime where absorption effects are significant. As mentioned before the solution can be found in using many apertures within the optic, with each aperture spraying the entire mask with as uniform a flux as is practicable. A typical design has on the order of 100 facets, so that even a severe defect in one facet can cause no more than a 1% beam uniformity error.

Flat mirrors have a natural uniformity of beam. They are non-uniform only when occulted or when a large range of graze angle leads to non-uniform reflection efficiency.

Magnification Correction. A small amount of magnification correction can be achieved by moving the optic closer or farther from the mask. This allows the rays some extra measure of spreading between mask and photoresist to create perfect alignment in an otherwise mis-scaled pair. As the optic moves farther away, the global divergence will cause a dilution of the flux. This could be compensated for by a new optic with more internal focusing.

Bandpass. The bandpass is adjustable in the way that is usual for grazing optics. The design is an optimization of higher graze angle and thus larger angular collection, versus loss of signal to reflection. A single reflection system at two degrees will have excellent throughput up to 2 keV. Beyond that, losses are severe. However, since most proximity lithography is performed near one kilovolt, this is near optimum. Since the basic geometry features only a single reflection, the high energy cutoff is slow and the design is robust against changes in reflectance.

Source Size and Distance. The actual region from which the x-rays emanate inside the source must be properly handled. Most x-ray sources generate flux in a region typically 0.5 mm to 1 mm in diameter. If the source is too close to the mirrors of the collimator, the angular size of the spot can become comparable to the graze angle, and strong system losses occur. However, for a 1 mm spot to exceed 2 degrees requires that the collimator come within 28 mm of the source, which is quite close.

Indeed, many sources have constraints that require optics to be held at a minimum distance. Since our invention requires a small optic, this can become, in some cases, a problem. The optic can be placed inside the source in some cases. In others, a pre-collimator may be required.

Another effect of the source size is blurring, which can cause a decrease in flux near the corners of the mask. Each facet projects a trapezoid onto the mask. If the source is point-like, the projected edges of the facets will be sharp at the mask. The size of the source causes a blurring in the edge of each trapezoid on the mask. The scale of the blurring is comparable to the size of the source, multiplied by the magnification, which is about equal to the distance from the facet to the mask divided by the distance from the facet to the source. Each trapezoid must be large enough that none of the decrease near the edge is allowed to fall on the mask. Making the trapezoids larger means making the facets larger and spreading the beam over more area of the mask. This causes a lowering in beam intensity from the ideal. On the whole, smaller sources are more efficient with this collimator.

Kirkpatrick-Baez Geometry: Grazing incidence optics tend to fall into one of two categories, Wolter or Kirkpatrick-Baez. The Wolter systems feature a cylindrical symmetry, and nested geometry for multiple channels. Kirkpatrick-Baez (K-B) geometries use flat (or nearly flat) mirrors, one per dimension. A crisscross geometry is used to create multiple channels. The preferred embodiment examples fall in the Wolter category in that the mirrors are arranged with cylindrical symmetry. However, K-B geometries are acceptable for this invention. Using a crisscross geometry, flat, cylindrical, or spherical surface mirrors may be mounted in a linear array. There are however, some drawbacks to K-B geometries. First, they require two reflections per photon, reducing throughput due to reflection losses. Second, the geometry causes the physical thickness of the first layer of mirrors to occult a substantial fraction of the collecting angle of the second layer, requiring a push to thin mirrors. Third, the channels are at the corners of the square aperture, where they most easily violate the local divergence requirement. Nonetheless, K-B systems are a viable alternative and are particularly easy to build.

Wolter Optics: Mirrors arranged in a cylindrical geometry create a close approximation to a Wolter geometry. One can build a collimator of this class by using a toroidal or ellipsoidal geometry in the mirror, without the flat subchannels. However, this leads to an undesirable effect on uniformity. Since the rays are then focused in both dimensions, the radiation reaches the mask as a point focus. Even the in-plane defocus is inadequate, since this still leaves a central bright point with a radial intensity distribution. The flatness of the facets in the off-plane direction allows the beam to spread across the entire mask, removing the radial distribution within the area of the mask. There are other ways to solve the Wolter problem, but none appear to be as simple or effective as the use of facets.

Curved Facets: Each of the flat facets may in principle be replaced by a curved surface optic. A sphere is the simplest optical element that will concentrate the light on the mask. Concave surface facets will tend to reduce the number of facets needed, while convex surface facets will increase the number of facets. However, the spheres create an intrinsic in-plane non-uniformity, due mostly to coma. It is possible to substitute a more complex surface, such as a parabola, ellipse, hyperbola, or other generalized shape to create a more uniform in-plane geometry, and hence a more uniform exposure to the mask.

Variation of Azimuthal Facet Spacing: The masks in use for lithography tend to be square in shape. In our example, we used the same radius of curvature for all the spheres around the annulus. Each was set so that the beam from the facet would spread to greater than 42 mm (the diagonal) at the mask. However, those facets that are aligned at azimuthal angles closer to 0, 90, 180, and 270 degrees than to 45, 135, 225, and 315 degrees, need only cover 30 mm. A slightly smaller azimuthal extent on these mirrors would place a allow a few extra facets and thereby place a somewhat higher fraction of the radiation on the mask. Ideally, each facet would be optimized for its azimuthal orientation.

Open Center: It should be noted that there is no need to shield the direct rays that emerge from the source and fly straight up through the center of the optic without reflecting. As long as the central aperture is greater in size than a typical channel, the rays from the center will impinge uniformly on the mask and satisfy global and local divergence. The open center adds to the total flux at the mask and simplifies construction of the collimator.

Multiple Rings: Wolter geometries naturally tend to be nested if maximum performance is to be achieved. Our invention is no exception. By using nested rings of facets, as shown in FIG. 3, the overall flux can be greatly enhanced. FIG. 3 is a view from the mask toward the x-ray source 10 showing an array of 24 mirrors 20 in two concentric rings placed in an azimuthal geometry around the central x-ray source 10. Flux from the source 10 can be let directly through the center. It is possible to have up to 22 spots per ring and many rings.

Each of the concentric mirror rings is located a predetermined distance, $d_N$, from the target along an optical axis extending from the x-ray source to the target. Here again, $d_N$ must be greater than the divergence point, D, to satisfy the global divergence requirement. In addition, the local divergence requirement (L) is met if the regions of each ring reflecting radiation onto the field of exposure of the target have a diameter less than $L \cdot d_N$.

This multi-ring configuration makes possible gain improvements in excess of 100. Factors of four or five improvement in flux can be envisioned. Of course, there is an engineering challenge to closely nest such small mirror arrays 20.

Multilayer Coatings: Multilayer coatings can also be used to enhance performance of the optical system. One well-known example is the multilayer coatings that are placed on eyeglasses to suppress internal reflection. Multilayer coatings have also proven very valuable in the x-ray band. The two major advantages to using multilayer coatings are use of higher reflection angles, and the possibility of spectral shaping of the beam. These two properties can greatly enhance performance or simplify design and fabrication in some, but not all, applications. The use of higher graze angles can significantly shorten a system. At low graze angle, an increase in graze angle of a factor of $\alpha$ leads to the same aperture with a mirror a factor of $\alpha$ shorter. Also, if the beam is being steered through a large angle by using multiple reflections, the required number of reflections also drops by a factor of $\alpha$. Thus the overall length savings can scale by as much as $\alpha^2$. Since a multilayer coating can typically increase graze angle by a factor of three, length can be reduced by an order of magnitude. However, multilayer coatings also have some disadvantages, in that the range of incident angles is reduced, total system throughput is reduced, and fabrication is substantially complicated.

Figure 4:
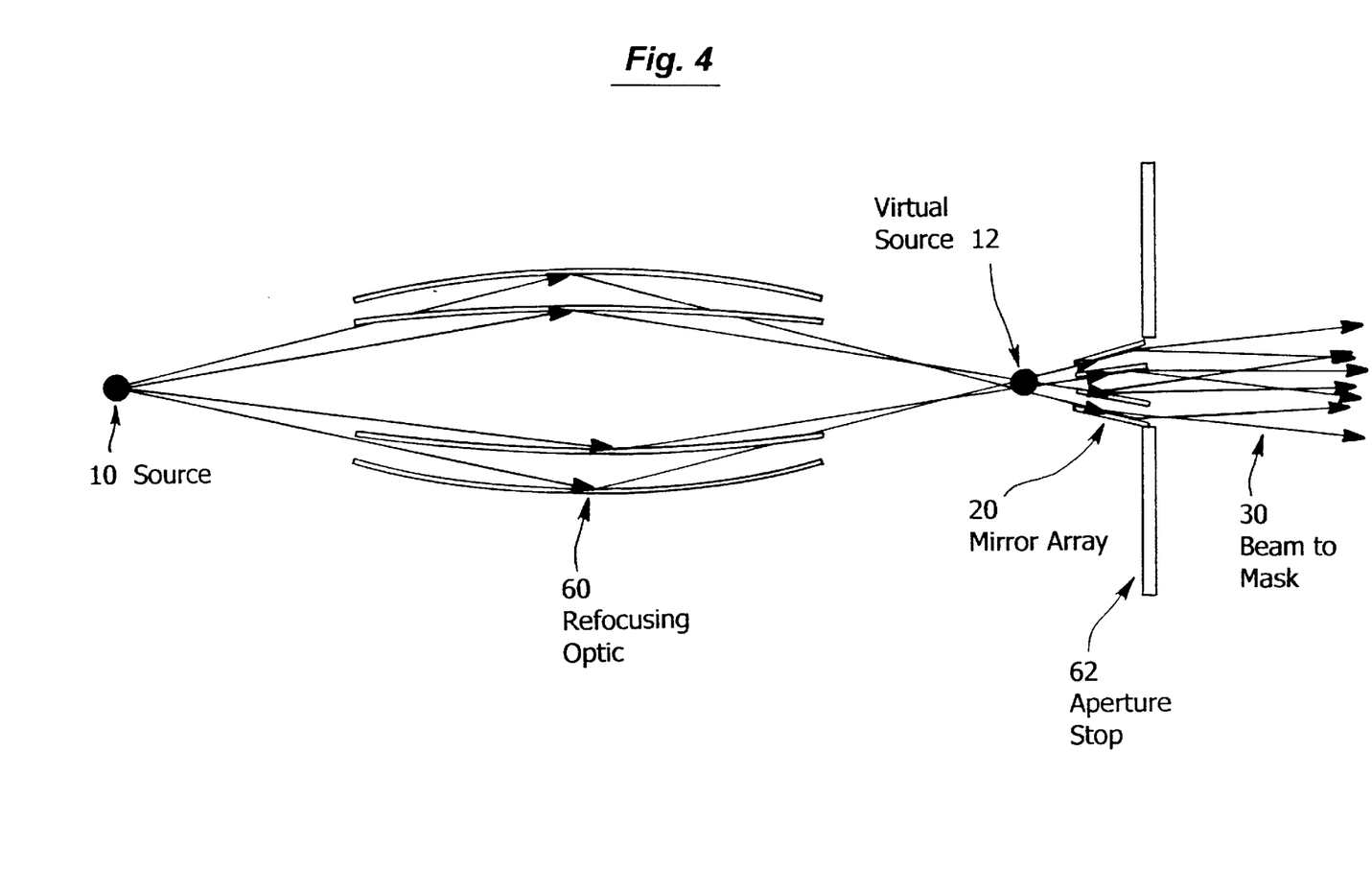
FIG. 4 is a cross-sectional view of an alternative embodiment in which a large refocusing optic is used to create a virtual image or images that can be redirected through the exit aperture.

Refocus: Some x-ray sources have intrinsic requirements on the geometry around the point of emanation. Thus, sometimes one may not be free to place the small collimator in close to the x-ray source 10. There is a solution to this problem. A larger refocusing optic 60, may be placed a large distance away from the source 10. It gathers the diverging light and refocuses it to create a virtual source 12 near the exit pupil. The design of this refocusing optic 60 may be as simple as an ellipsoid of rotation. The new focal point or points are then reflected by the mirror array 20 through the exit aperture 62 toward the mask 30, as shown schematically in FIG. 4. There are disadvantages to this approach. First, there are multiple reflections, some at higher angles, leading to greater flux losses. Second, the system is longer. Third, two optics need to be fabricated and matched. The advantages, however, can also be substantial. First, the optics are physically out of the way of the source 10. Second, they are sufficiently distant to be safe from damage by the high-energy activity in the source. Third, the optics are larger, allowing tighter nesting, and some relief from the engineering difficulties of tiny optics. The mirror facets 20, while still tiny, do not need to be as complex as when they do the job alone.

Beamline: Perhaps the single greatest adverse design constraint in this invention is the relatively large distance required between the source and the mask. Most x-ray lithography systems use helium between the source and mask, because helium is the lowest-absorbing non-flammable gas. However, at 11 Å, a typical wavelength for x-ray proximity lithography, helium absorbs 76% of the intensity over two meters, rising to 94% at four meters. Thus, losses are considerable at two meters and completely unacceptable at four or more meters.

One possible solution is to insert a vacuum beamline between the source 10 and mask 30. The schematic diagram of such a beamline 50 is presented in FIG. 5. The beamline 50 consists of a vacuum pipe 51 that is maintained at low pressure by a vacuum pump 52. At one end of the pipe 51 is the x-ray source 10. If the source 10 operates at high pressure, it needs to be isolated from the vacuum by an entrance window 53. At the other end of the pipe 51, the beam passes through an exit window 54 that keeps the helium around the mask 30 from entering the vacuum pipe 51.

The windows should be made of low absorption materials. Plastic materials, such as polypropylene, tend to be unsuitable because the flux of x-rays will destroy the molecular bonds in the plastic and cause window failure. The windows can be made from sheets of low mass metals, such as beryllium and aluminum with a thickness of a few microns or less.

Figure 5:
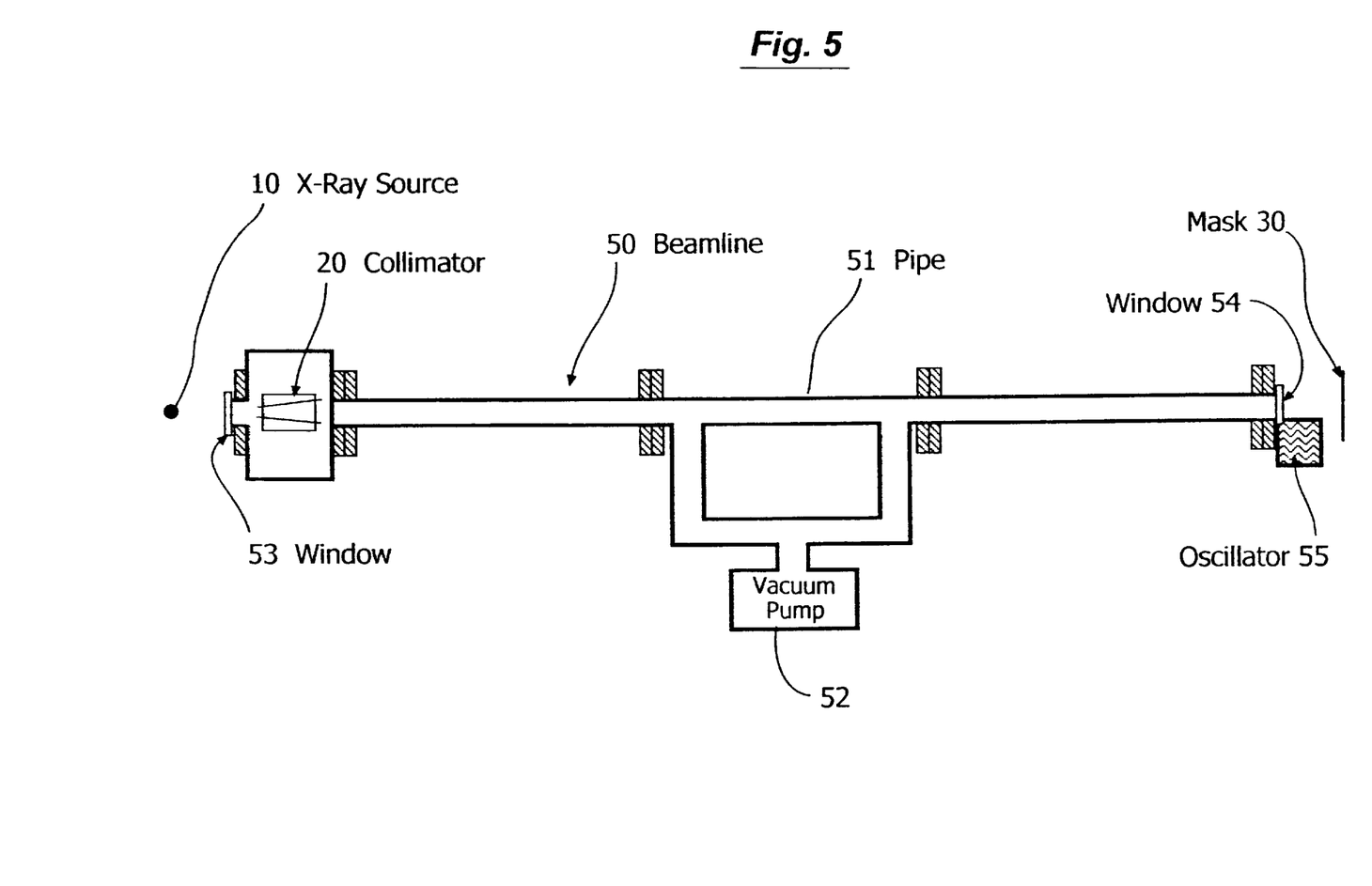
FIG. 5 is a cross-sectional view of another embodiment that includes a vacuum beamline between the source and mask. Both the source and mask are in air or helium, but the collimator and most of the beam path are at vacuum to maintain a high beam intensity.

As the windows are made thinner, the materials become more transmissive, but mechanically weaker. In order to hold off a full atmosphere of pressure, the thinner windows need to be supported by a metallic mesh. The mesh, in turn, can project shadows onto the mask 30, creating unacceptable non-uniformity. If a heavy mesh is required, the exit window must be oscillated by an oscillator 55 during the exposure to smooth out the effects of the mesh.

EXAMPLE 1

In this example we describe an optic that contains three rings of flat facets, and creates a very high intensity, very high uniformity flux at the target. The use of nothing but flats renders the optic easy to fabricate by a variety of techniques.

Figure 6:
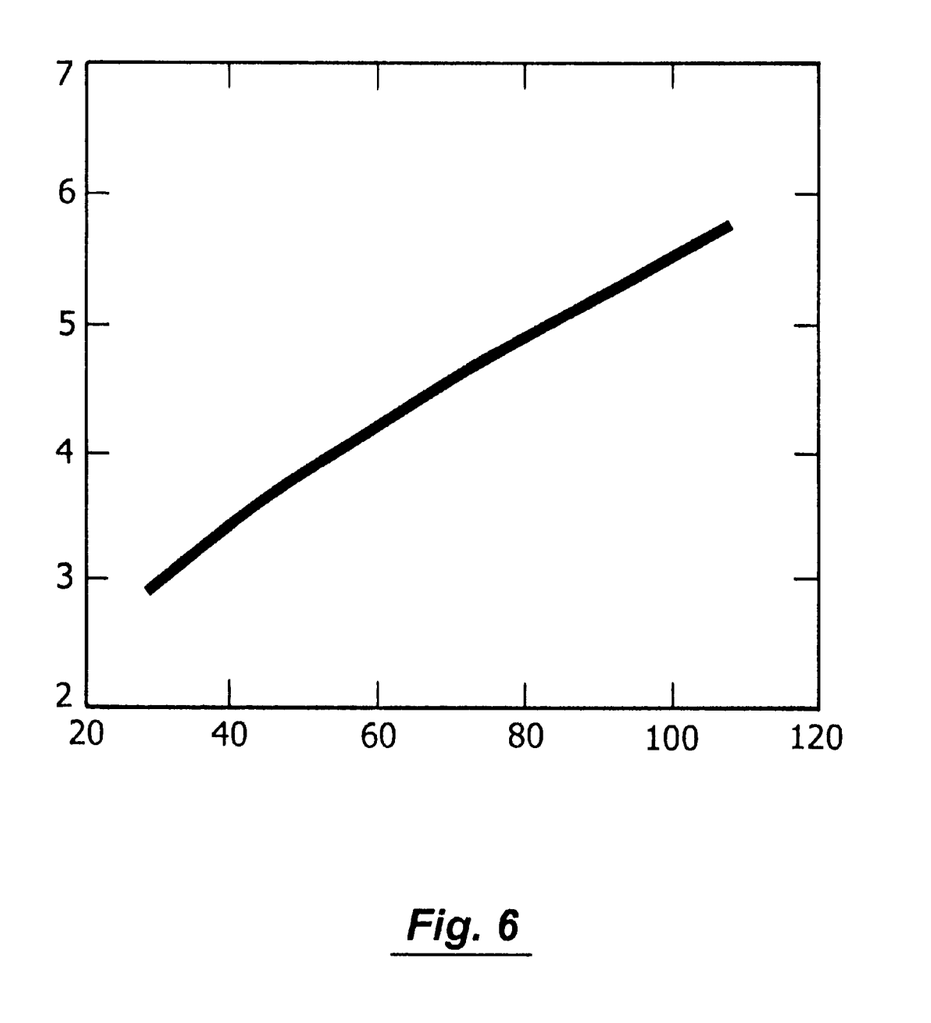
FIG. 6 is a graph outlining the edge of the optic as a function of the distance from the nominal position for the source. The optic is actually a figure of rotation, flattened into facets. This example shows three rings of facets.

The optic consists of three rings of flat facets. The first ring starts 29 mm from the source along the optic axis and extends to 45 mm. The facets are located 2.9 mm off axis at the near end, and 3.6 mm off axis at the far end. The second ring picks up at 45 mm and extends to 72 mm, with radius of 3.6 mm rising to 4.6 mm. The third ring stretches from 72 to 108 mm along the optic axis, with radius rising from 4.6 to 5.7. This geometry is shown in profile in FIG. 6, which outlines the edge of the optic as a function of the distance from the nominal position for the source. The optic is actually a figure of rotation, flattened into facets. This example shows three rings of facets. Each ring has a different number of facets, with the number optimized to maximize flux at the target without sacrificing uniformity. The first ring has 30 facets (12 degrees each) set uniformly around the azimuthal direction. The second ring has 24 facets (15 degrees each) and the third ring has 20 facets (18 degrees each). The internal surface of the optic is coated with iridium to provide good reflectivity at grazing incidence to x-ray energies as high as 1.5 keV. The optic is placed so that the source is 2388 mm from the target.

Figure 7:
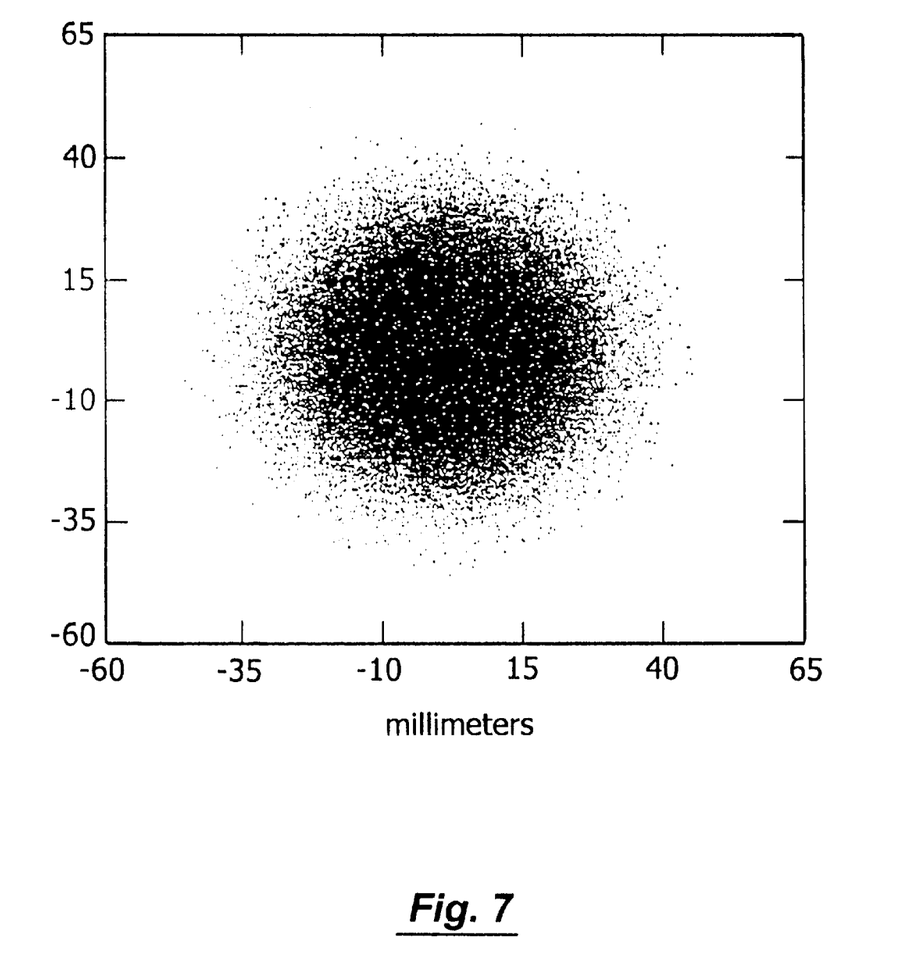
FIG. 7 is a graph showing a raytrace simulation of the optic illustrating that the radiation impinging on the target has a circular symmetry reflecting the circular symmetry of the lens.
Figure 8:
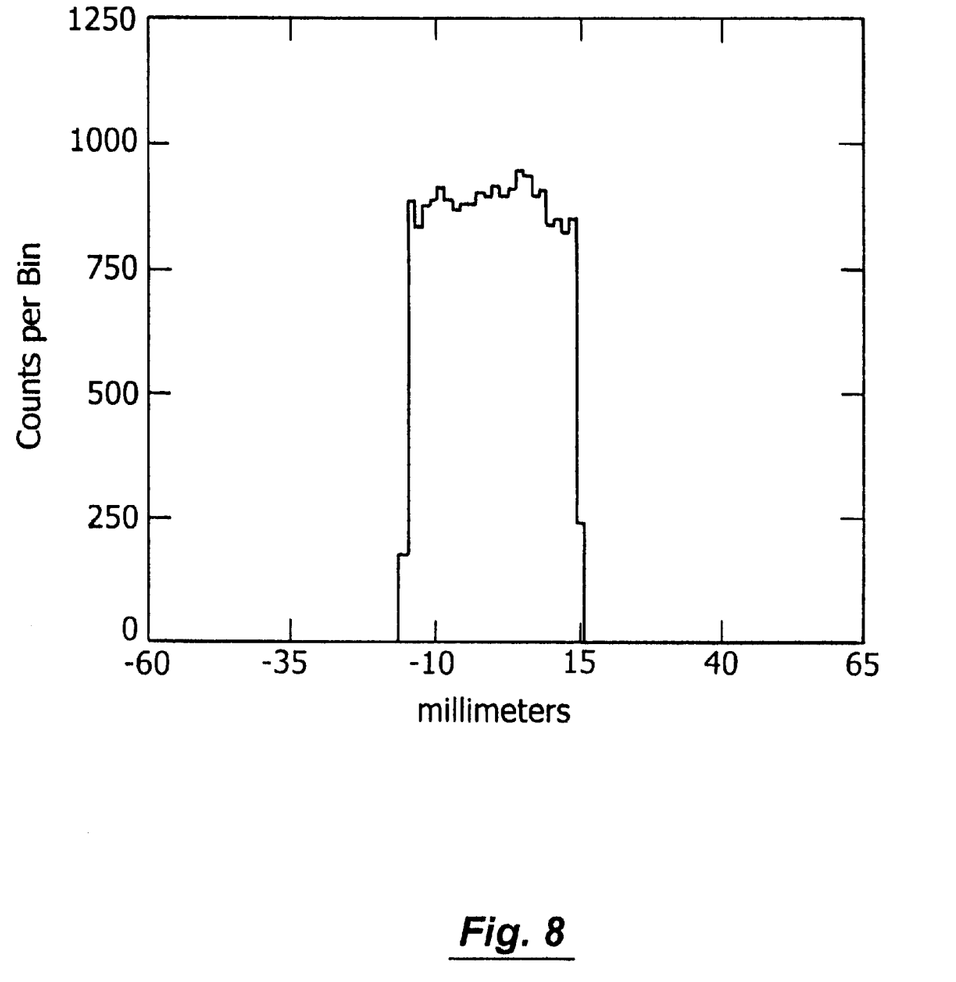
FIG. 8 is a histogram illustrating that the distribution of radiation is highly uniform when the central portion of the circular distribution is cut in a 30×30 mm square to simulate the part of the beam that strikes the mask.

Raytracing of this design at 1 keV, including reflectivity losses and a 0.5 mm diameter source, is shown in FIGS. 7 and 8. FIG. 7 shows the circular pattern of the rays arriving at the target. It contains a broad, circular region of uniform illumination with diameter of 42 mm. A rapid fall-off in intensity occurs outside the central region. FIG. 8 shows a histogram of ray positions across a 30 mm square set inside the 42 mm circle. The excellent uniformity is apparent. The non-uniformities in this histogram are entirely the result of counting statistics.

The efficiency of the system is excellent. For a source emitting 1 keV x-rays at a rate of 1 W/steradian, the 30 mm square, which represents the mask, receives over 0.006 W. The global divergence is about 0.018 radians, highly uniform, and predictable. The local divergence is 0.005 radians full width zero max. Thus it provides high, uniform flux and meets all beam requirements.

EXAMPLE 2

While we stress that there are many variations of this invention we present a design example that shows how simple and powerful this collimator is. In this example we will use sections of spherical surface mirrors to create an intense uniform beam.

We start the design process with a single flat mirror 20 as shown in FIG. 1. The flat mirror 20 is placed at grazing incidence such that it reflects radiation onto a mask 30 and wafer 40 in a uniform pattern. If the virtual image 12 the flat 20 creates is sufficiently close to the original x-ray source 10, the global and local divergence requirements are met. If the mirror 20 does not occult the image, the flux from the mirror 20 is nearly as uniform as the direct beam. Only a small reflectivity effect is seen across the mask 30. In this particular embodiment, the x-ray source 10 is placed 2.2 meters from the 30 mm mask 30. We define the flux from the source 10 that impinges directly on the mask 30 and wafer 40 to have a value of one. Now, we add the flat mirror 20 so that it catches some of the x-rays that were leaving the source 10 four degrees off axis and redirects them, via a two degree grazing reflection back toward the mask 30 and wafer 40. When viewing the source 10 from the position of the mask 30, there now appear to be two sources 10, 12 separated by less than 5 mm, at a distance of 2.2 m. The second source 12 is only 65% as bright as the first, as it has reflection losses. The flux at the mask 30 now has a value of 1.65.

Figure 9:
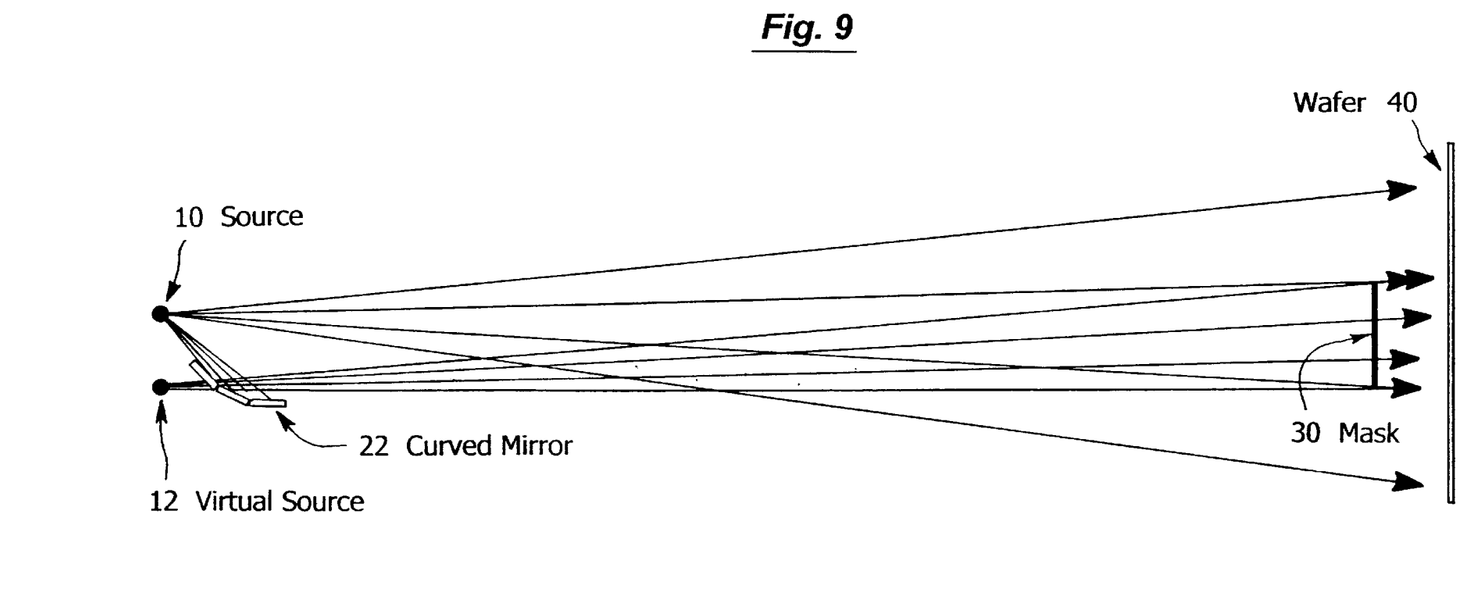
FIG. 9 is a cross-sectional ray trace diagram in which the flat mirror has been replaced with a concave mirror leading to concentration of the flux from the mirror.

In FIG. 9, we replace the flat mirror 20 with a sphere or cylinder 22. At this angle they are functionally equivalent.

We choose a sphere with a 6 meter radius of curvature. This will narrow the emerging beam and approximately double the number of x-rays hitting the mask 30 off the mirror 22, as shown in FIG. 9. The concave mirror 22 now creates a flux of 1.3 at the mask, for a total flux of 2.3 out of the system. It is clear that a second mirror, placed opposite the first mirror would lead to a system flux of 3.6.

Each of these mirrors need only be about 1.2 mm wide and 60 mm long. The 1.2 mm width at 60 mm in the off-plane spreads to a width of 42 mm at 2.2 m, enough to cover the diagonal of the 30 mm mask. FIG. 3 shows that twenty two mirrors 20 can be placed around the circumference at 60 mm. Thus, any point on the mask 30 would see 23 sources, 22 in a ring, for a total flux of 29.6. The flux at the mask 30 is now almost 30 times what it would be without a collimator!

Figure 10:
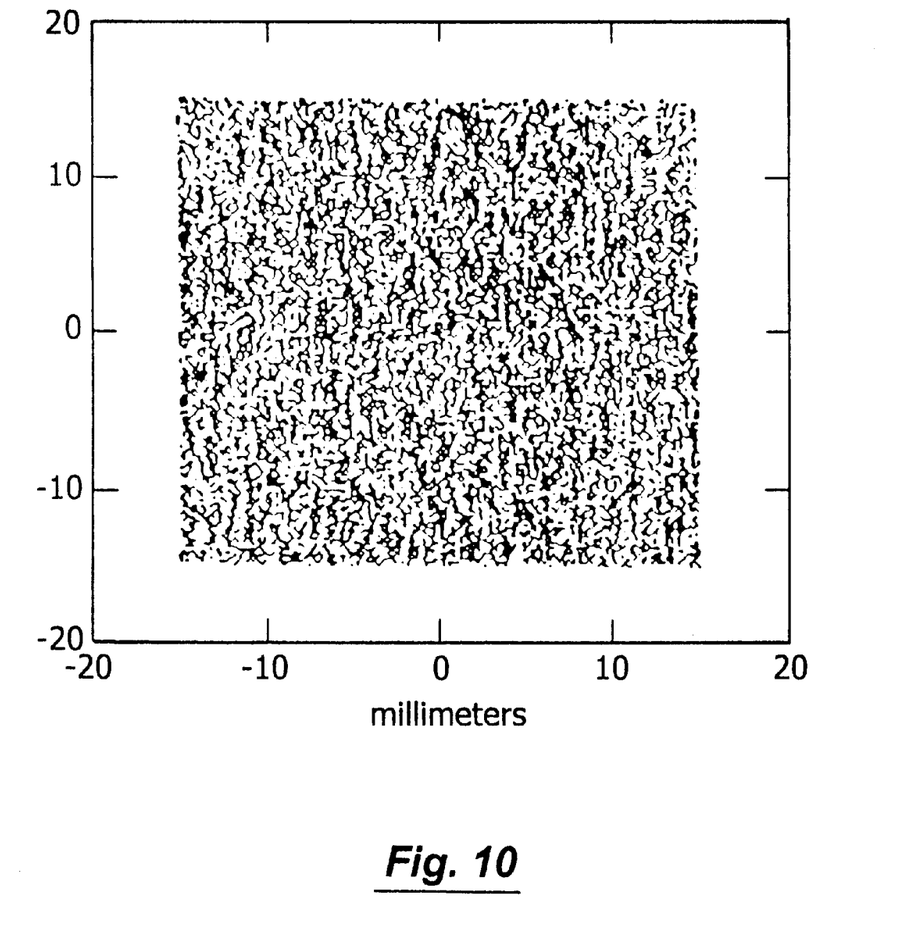
FIG. 10 is a graph showing a raytrace of a single ring with 22 mirror facets shows excellent uniformity at the mask.
Figure 11:
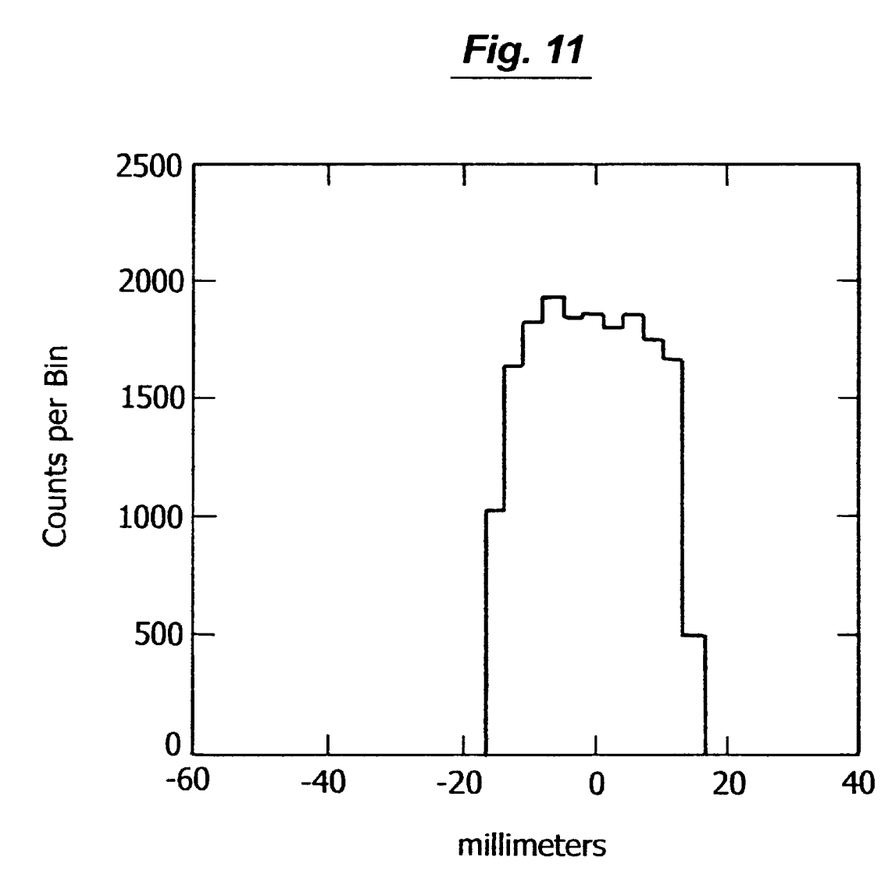
FIG. 11 is a histogram of the raytrace corresponding to FIG. 10 showing quantitatively that the radiation across the mask is highly uniform.

We have performed a raytrace analysis of this design, including the effects of absorption in the mirror. The results in FIGS. 10 and 11 demonstrate excellent uniformity. FIG. 10 is a graph showing a raytrace of a single ring with 22 mirror facets. The raytrace includes losses due to reflectivity with 12 Å radiation. FIG. 11 is a histogram of the raytrace showing quantitatively that the radiation across the mask is highly uniform. The global divergence is under 0.02 radians, the local divergence is under 0.005 radians, and the total flux striking the 30 mm square is 32.4 times that expected without a collimator.

The above disclosure sets forth a number of embodiments of the present invention. Other arrangements or embodiments, not precisely set forth, could be practiced under the teachings of the present invention and as set forth in the following claims.

I claim:

1. An x-ray collimator primarily for lithography requiring a maximum global divergence, G, and a maximum local divergence, L, said collimator comprising:

a target having a field of exposure with a diameter, F;

an x-ray source located at a distance from said target greater than the divergence point, D, where D=F/G; and     a plurality of mirrors arranged to reflect x-ray radiation from said source at grazing incidence onto said target, each of said mirrors being located at a distance, d, from said target greater than D, said reflected radiation being emitted from a region having a diameter less than L·d.

2. The collimator of claim 1 wherein each of said mirrors is arranged to reflect said radiation in substantially uniform pattern over said field of exposure of said target.

3. The collimator of claim 1 wherein at least one of said mirrors is substantially flat.

4. The collimator of claim 1 wherein at least one of said mirrors is substantially spherical.

5. The collimator of claim 1 wherein at least one of said mirrors is substantially cylindrical.

6. The collimator of claim 1 wherein said mirrors are arranged in a radial pattern about said source.

7. The collimator of claim 1 further comprising a vacuum beamline between said x-ray source and said target.

8. The collimator of claim 6 further comprising a refocusing optic receiving x-ray radiation from said source and refocusing said radiation to create a virtual source adjacent to said mirrors.

9. The collimator of claim 1 wherein said mirrors are arranged in a plurality of concentric rings about said source.

10. The collimator of claim 1 wherein local divergence, L, is approximately 0.005 radians or less.

11. The collimator of claim 1 wherein global divergence, G, is approximately 0.02 radians or less.

12. The collimator of claim 1 wherein at least one of said mirrors further comprises a multilayer coating.

13. An x-ray collimator primarily for lithography requiring a maximum global divergence, G, and a maximum local divergence, L, said collimator comprising:

a target having a field of exposure with a diameter, F;

an x-ray source located along an optical axis at a distance from said target greater than the divergence point, D, where D=F/G; and     a plurality of mirrors arranged to form a ring about said optical axis located at a distance, d, from said target greater than D, with each of said mirrors reflecting x-ray radiation from said source at grazing incidence onto said target, said reflected radiation from said mirrors being emitted from a region of said ring of mirrors having a diameter less than L·d.

14. The collimator of claim 13 wherein said ring of mirrors comprises a central aperture along said optical axis permitting said source to directly illuminate said field of exposure of said target.

15. The collimator of claim 13 wherein each of said mirrors is arranged to reflect said radiation in substantially uniform pattern over said field of exposure of said target.

16. The collimator of claim 13 wherein at least one of said mirrors is substantially flat.

17. The collimator of claim 13 wherein at least one of said mirrors is substantially spherical.

18. The collimator of claim 13 wherein at least one of said mirrors is substantially cylindrical.

19. The collimator of claim 13 further comprising a vacuum beamline between said x-ray source and said target.

20. The collimator of claim 13 further comprising a refocusing optic receiving x-ray radiation from said source and refocusing said radiation to create a virtual source adjacent to said ring of mirrors.

21. The collimator of claim 13 wherein at least one of said mirrors further comprises a multilayer coating.

22. An x-ray collimator primarily for lithography requiring a maximum global divergence, G, and a maximum local divergence, L, said collimator comprising:

a target having a field of exposure with a diameter, F;

an x-ray source located along an optical axis at a distance from said target greater than the divergence point, D, where D=F/G; and     a plurality of concentric mirror rings about said optical axis reflecting x-ray radiation from said source at grazing incidence onto said target, each of said mirror rings being located at a distance, $d_N$, from said target greater than D, and wherein each of said mirror rings reflects said radiation onto said target from a region of said ring having a diameter less than $L \cdot d_N$.

23. The collimator of claim 22 wherein said mirror rings further comprise a central aperture along said optical axis permitting said source to directly illuminate said field of exposure of said target.

24. The collimator of claim 22 further comprising a refocusing optic receiving x-ray radiation from said source and refocusing said radiation to create a virtual source adjacent to said mirror ring.

25. The collimator of claim 22 further comprising a vacuum beamline between said x-ray source and said target.

26. The collimator of claim 22 wherein at least one of said mirror rings further comprise a multilayer coating.

* * * * *